(12) United States Patent
Smith

(10) Patent No.: US 8,422,027 B2
(45) Date of Patent: Apr. 16, 2013

(54) IMAGING OPTICAL SYSTEM FOR PRODUCING CONTROL INFORMATION REGARDING LATERAL MOVEMENT OF AN IMAGE PLANE OR AN OBJECT PLANE

(75) Inventor: Daniel Gene Smith, Tucson, AZ (US)

(73) Assignee: Nikon Corporation, Chiyoda-ku, Tokyo (JP)

( * ) Notice: Subject to any disclaimer, the term of this patent is extended or adjusted under 35 U.S.C. 154(b) by 172 days.

(21) Appl. No.: 12/796,461

(22) Filed: Jun. 8, 2010

(65) Prior Publication Data

US 2011/0299092 A1  Dec. 8, 2011

(51) Int. Cl.
*G01B 11/02* (2006.01)

(52) U.S. Cl.
USPC ........................................................ 356/499

(58) Field of Classification Search .................. 356/499, 356/521
See application file for complete search history.

(56) References Cited

U.S. PATENT DOCUMENTS

| 4,705,940 | A  |   | 11/1987 | Kohno              |         |
|-----------|----|---|---------|--------------------|---------|
| 4,952,815 | A  |   | 8/1990  | Nishi              |         |
| 5,048,967 | A  |   | 9/1991  | Suzuki et al.      |         |
| 5,053,628 | A  |   | 10/1991 | Yamamoto et al.    |         |
| 5,114,236 | A  | * | 5/1992  | Matsugu et al.     | 356/401 |
| 5,268,744 | A  |   | 12/1993 | Mori et al.        |         |
| 5,434,425 | A  |   | 7/1995  | Ishiyama           |         |
| 6,285,455 | B1 |   | 9/2001  | Shiraishi          |         |
| 7,612,892 | B2 |   | 11/2009 | Smith et al.       |         |
| 2004/0080755 | A1 | * | 4/2004 | Tamiya et al.    | 356/499 |
| 2007/0080281 | A1 | * | 4/2007 | Smith et al.     | 250/201.2 |

* cited by examiner

*Primary Examiner* — Tarifur Chowdhury
*Assistant Examiner* — Jonathon Cook

(57) ABSTRACT

A new and useful concept is provided by which control information for an imaging optical system such as a lithographic imaging optical system can be generated. A system and method are disclosed that are designed to detect changes in the lateral position of an image plane or object plane in an imaging optical system, particularly a lithographic imaging optical system.

17 Claims, 3 Drawing Sheets

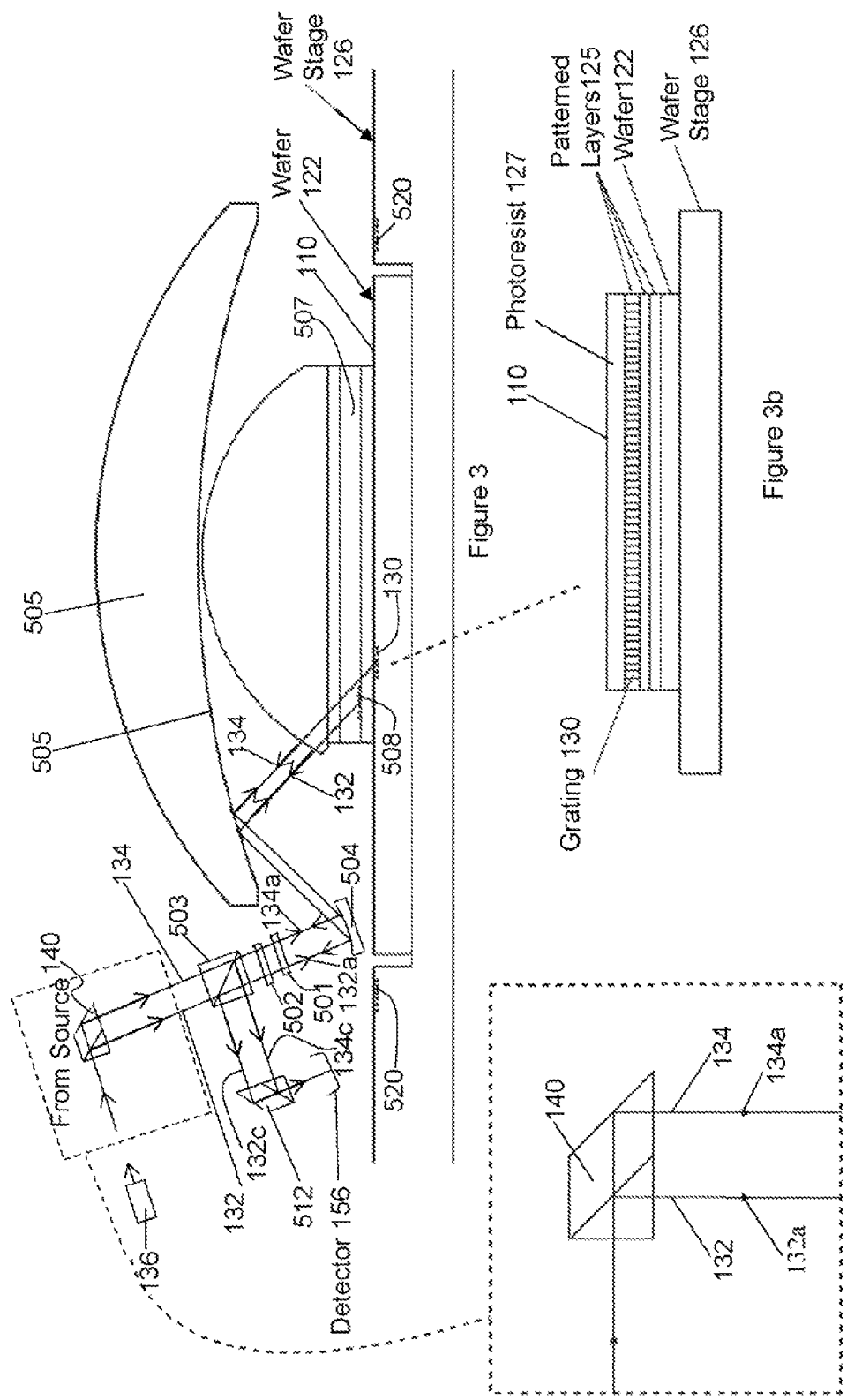

IMAGING OPTICAL SYSTEM FOR PRODUCING CONTROL INFORMATION REGARDING LATERAL MOVEMENT OF AN IMAGE PLANE OR AN OBJECT PLANE

BACKGROUND

The present invention relates to an imaging optical system, and particularly to a new and useful way of producing control information for the imaging optical system. The present invention is particularly useful in providing control information for an imaging optical system such as a lithographic imaging optical system.

In U.S. application Ser. No. 11/544,833, filed Oct. 5, 2006, assigned to the assignee of the present invention, and incorporated by reference herein, there is disclosed a system providing control information for an imaging optical system such as a lithographic imaging optical system. In that system, imaging optics define a primary optical path along which a primary image is projected (e.g. onto a wafer), and a measurement optical path is established and includes at least part of the primary optical path. The imaging optical system is configured to obtain information from the measurement optical path for use in providing control information for the imaging optical system. The system includes, e.g. optics, detectors, electronics, and mechanics etc., which detect the information from the measurement optical path, and produce control data that are useful in the imaging optical system. The metrology features that are provided by the system of that application are sometimes referred to by applicants as "through the lens" metrology, because the measurement optical path, in those cases, is at least partially through the primary optical path.

The principles of U.S. patent application Ser. No. 11/544,833 are primarily useful in controlling positioning of the wafer in directions that are toward and away from the imaging optics.

SUMMARY OF THE INVENTION

The present invention provides imaging alignment concepts that are designed to further improve the manner in which control information for an optical system such as a lithographic imaging optical system can be generated. The present invention provides a system and method designed to detect changes in the lateral position of an image plane or object plane in an imaging optical system, particularly a lithographic imaging optical system, thereby providing control information that can be used to control the lateral alignment of the image plane or the object plane. The principles of the present invention are particularly useful in providing control information for lateral alignment of a wafer in a lithographic imaging optical system.

According to the present invention, an imaging optical system has a primary imaging optical system that directs an image along a primary imaging path from an object plane to an image plane. A measurement diffraction grating is integrally connected with one of the image plane or the object plane, and moves with the one of the image plane or object plane in directions lateral to the primary imaging path. A reference beam and a measurement beam originate outside the primary imaging path. The measurement beam is directed at the measurement diffraction grating on the one of image plane or the object plane, to produce a diffracted measurement beam, while the path of the reference beam is such that the reference beam is unaffected by changes in the lateral position of the one of the image plane or the object plane. At least components of the reference beam and the diffracted measurement beam component are directed at a detector configured interferometrically to detect phase changes between the reference beam component and the diffracted measurement beam component, to produce an output related to changes in the lateral position of the one of the image plane or the object plane. That output can be used to provide lateral alignment control of the image plane or the object plane.

In one version of the present invention, the image plane is integrally connected with a surface of a wafer, and the measurement diffraction grating is integrally connected with the surface of the wafer in such a manner that when the image plane moves laterally with the wafer relative to the primary imaging path, the measurement diffraction grating moves laterally with the image plane.

In another version of the present invention, the image plane is integrally connected with a surface of a wafer that is supported on a wafer stage, and the measurement diffraction grating is integrally connected with a portion of the wafer stage that is outside the primary imaging path, in such a manner that when the wafer stage moves laterally relative to the primary imaging path, the measurement diffraction grating moves laterally with the wafer stage.

In yet another version of the present invention, the object plane is integrally associated with a scanning object (e.g. a reticle), and the measurement diffraction grating is integrally connected with the scanning object in such a manner that when the object plane moves laterally with the scanning object relative to the primary imaging path, the measurement diffraction grating moves laterally with the scanning object.

In each of the foregoing versions of the present invention, the reference beam can be a diffracted beam from one of the optics of the primary imaging optical system, or the reference beam can be provided from an external reference beam. The principal requirement of the reference beam is that it is not produced from any component that can move laterally with the image or object plane.

In the context of this application, a measurement diffraction grating that is "integrally connected" with one of the image plane, or the object plane, or with a surface of a wafer or a scanning object, means that the reference diffraction grating with always move laterally with the image plane, the object plane, the surface of the wafer or the scanning object (as the case may be). An image plane that is "integrally connected with a surface of a wafer" means that while the wafer may be comprised of several layers, the image plane would be formed on or so closely associated with a layer of the wafer (e.g. a photoresist layer) that an object would be imaged to that layer. Reference to a reference beam and/or a measurement beam as "originating outside" a primary imaging path means that whatever generates or produces the reference and/or measurement beam is not within the primary imaging optical path that directs an image from an object plane to an image plane, but does not exclude radiation (light) forming the reference and/or measurement beams from otherwise entering, being reflected and/or refracted by a portion of an optic that is part of the primary imaging optical path.

Other features of the present invention will become apparent from the following detailed description and the accompanying drawings.

BRIEF DESCRIPTION OF THE DRAWINGS

FIG. 3 is a schematic illustration how the principles of the present invention are implemented in an imaging optical system;

FIG. 3a is an enlarged, schematic illustration of a beam splitting optic in the system of FIG. 3; and FIG. 3b is an enlarged, schematic illustration of a wafer, water stage, and measurement diffraction gratings on the wafer and wafer stage in the system of FIG. 3, according to the principles of the present invention.

DETAILED DESCRIPTION

As discussed above, the present invention relates to a new and useful imaging concept designed to improve the manner in which control information for an imaging optical system (e.g. a lithographic imaging optical system) can be generated. The manner in which the principles of the present invention can be implemented in imaging optical systems of the type that are useful in a lithographic imaging optical system are described herein, and from that description, the manner in which the principles of the present invention can be implemented in various types of imaging optical systems will be apparent to those in the art.

Figure 1:
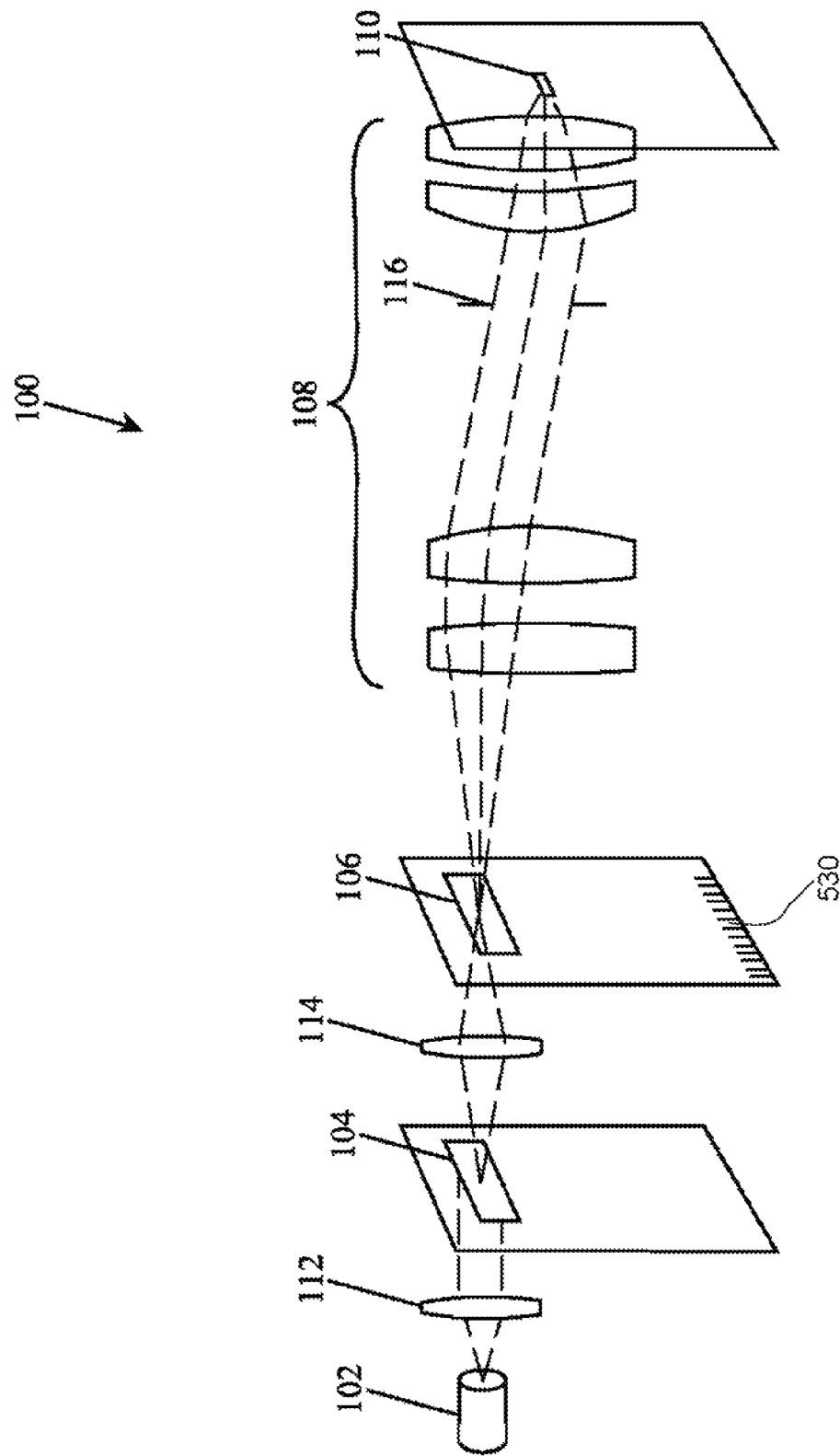
FIG. 1 is a schematic illustration of the basis components and operation of a lithographic imaging optical system with which the principles of the present invention can be used.

FIG. 1 schematically illustrates the general principles of a lithographic imaging optical system 100 of the type with which the principles of the present invention, for compensating birefringence, would be useful. The imaging optical system 100 comprises a radiation (e.g. light) source 102, a scanning slit 104 that is used to change the dimensions of the illumination area on a scanning object (or reticle) 106, and primary imaging optics 108 that image the scanned object onto an image plane 110. Such aspects of a lithographic imaging optical system are well known and should not require further description to those in the art. The system 100 also includes optics 112, 114 and a pupil 116 that would be well known to those in the art, and should not require further explanation.

Figure 2:
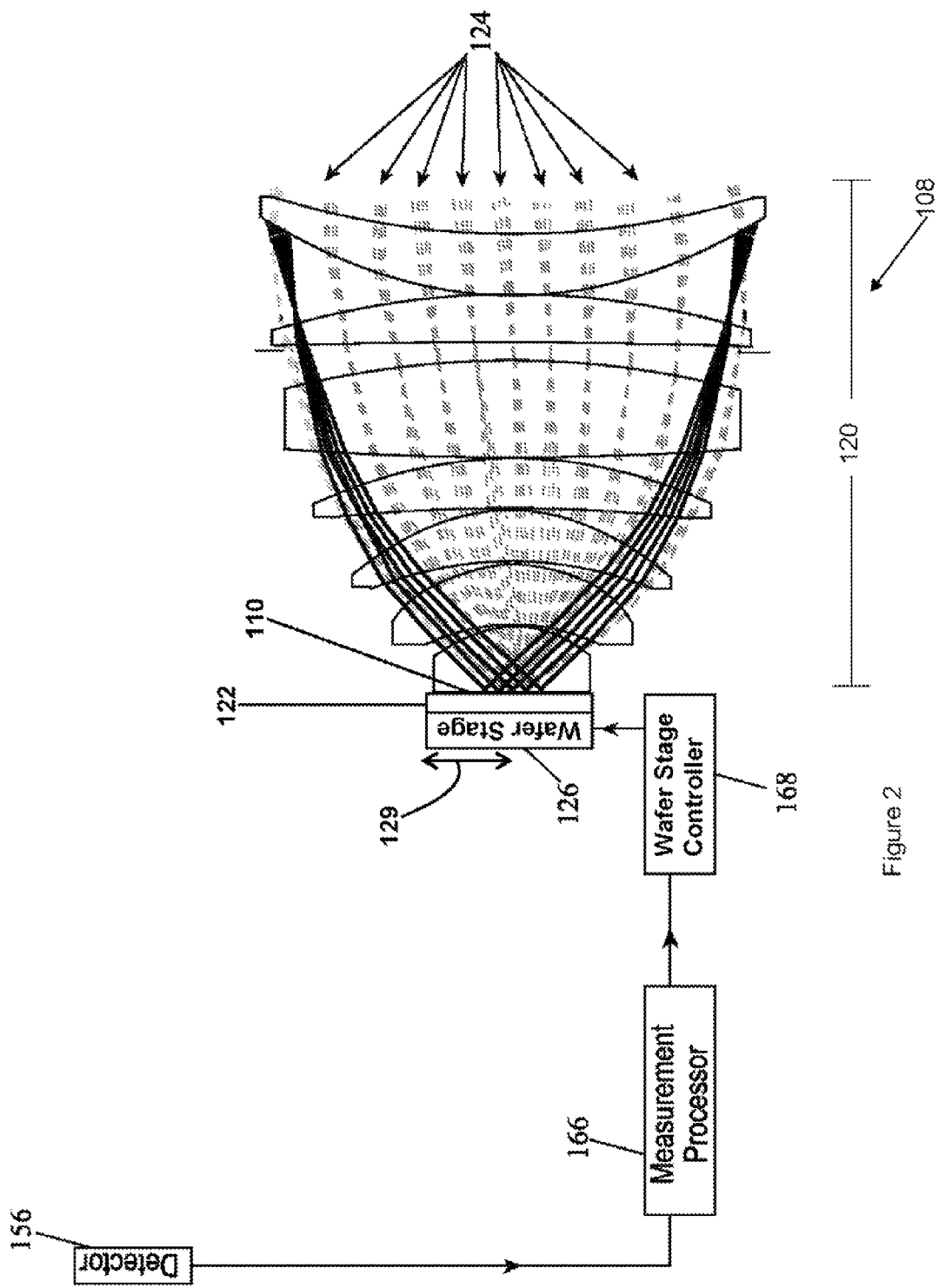
FIG. 2 schematically show components of a primary imaging optical system that direct an image along a primary optical imaging path, in a system and method according to the principles of the present invention.

FIG. 2 schematically illustrates how the principles of the present invention can be applied to provide control signals for an imaging optical system of the type shown in FIG. 1. The primary imaging optics 108 includes a lens 120 (that may comprise a plurality of lens elements), which defines a primary optical path by which radiation (light) that originates at the object or reticle is directed through the primary imaging optics to form an image of the reticle on a wafer image plane 110. In FIG. 2, the primary optical path is shown by image rays 124. The wafer image plane 110 is a layer of photoresist on a semiconductor wafer 122 that is supported by a wafer stage 126. The wafer stage 126 can be controlled, in a manner which would be readily understood by those in the art, to adjust the lateral position of the wafer and its image plane 110 relative to the lens 120.

As schematically illustrated in FIG. 3b, the wafer 122 may have several patterned layers, and a photoresist layer 127 that is applied to the wafer (or to the patterned layers 125 of the wafer, and which is imaged by the primary imaging system, as is well known to those in the art. The image plane 110 would normally be the surface of the photoresist 127 that is adjacent the lens system 120. The photoresist layer 127 is integrally connected with the wafer 122 (and moves with the wafer 122), so that the image plane 110 is also integrally connected with the wafer 122 (and moves with the wafer). The system and method of the present invention, which is described in more detail below, is designed to produce from a detector 156 (FIG. 3) an output that is related to the alignment of the image plane 110 and wafer 122 in directions lateral to the primary imaging path (i.e. in directions shown in FIG. 2 by arrows 129). The detector 156 can be, e.g. a single element detector such as a photodiode that interferometrically detects phase changes between a measurement beam component and a reference beam component, described in more detail below, and produces output related to the lateral alignment of the wafer 122 and the image plane 110 relative to the primary imaging path. The detector 156 can also be of other types, e.g. an array of charged couple devices (CCDs), that can interferometrically detect phase changes between a measurement beam component and a reference beam component.

The detector 156 is in circuit communication with a measurement processor 166 (FIG. 2) that processes the output of the detector, to determine if an adjustment of the lateral position of the wafer relative to the lens system 120 should be made. If a lateral adjustment of the wafer position is desirable, the processor 166 provides appropriate control data to a wafer stage controller 168 (FIG. 2) to drive the wafer stage 126, thereby to provide the desired lateral positioning of the wafer 122 and the image plane relative to the primary imaging path.

The apparatus and method of the present invention are specifically designed for detecting changes in the lateral position of the image plane 110 or object plane in an imaging optical system, such as the imaging optical system of FIGS. 1-3. As described above, the primary imaging optical system of FIGS. 1-3 includes the lens 120 that directs an image along a primary imaging path from the object plane (e.g. the scanning object or reticle 106) to the image plane 110 that is integrally connected with the wafer 122. A measurement diffraction grating 130 is integrally connected with wafer 122 and is configured to move with the wafer in directions lateral to the primary imaging path. As seen in FIG. 3b, the measurement diffraction grating 130 is located between the photoresist layer 127 and the patterned layers 125 of the wafer 122. Thus, the measurement diffraction grating 130 moves with the image plane 110 in directions lateral to the primary imaging path.

A reference beam 132 and a measurement beam 134 originate outside the primary imaging path, e.g. from a source shown schematically at 136 in FIG. 3. Specifically, a beam from source 136 is directed at a beam splitting optic 140 (see also FIG. 3a) where it is split and reflected to produce the reference and measurement beams 132, 134. The reference and measurement beams are directed to a polarizing beam splitter 503 that linearly polarizes the reference and measurement beams. The reference and measurement beams are then transmitted through a 214 wave plate 502 that changes their linear polarization to circular polarization as they are directed in the direction of arrows 132a, 134a. The reference and measurement beams are then directed through a compensating optic 501 that compensates any polarization effects. Then, the reference and measurement beams are reflected from an optic 504 and from a surface 505a that forms part of one of the lens 505 of the primary imaging system.

The measurement and reference beams are then directed at diffraction gratings 130, 508 integrally connected, respectively, with the wafer 122 and a glass member 507 that forms part of the primary imaging optical system. The measurement and reference beams are diffracted by those diffraction gratings, so that diffracted measurement and reference beams are directed in the directions of arrows 134b, 132b, respectively. The diffracted measurement and reference beams are reflected from lens surface 505a and reflector 504, directed back through the compensating optic 501 and the λ/4 optic 502, where their circular polarization is changed back to linear polarization, their polarization is rotated 90 degrees, and they are directed to polarizing beam splitter 503. Beam splitter 503 produces reflected measurement and reference beam components that are reflected and superimposed by a beam splitting/combining optic 512, and those superimposed beam components produce interference effects that are detected by detector 156. Phase changes in the measurement beam component due to changes in the lateral alignment of the wafer 122/image plane 110, are detected interferometrically by detector 156 and produce output that can be used to adjust the lateral position of the wafer stage 126 (thereby to adjust the lateral position of the wafer 122 and the image plane 110).

In the foregoing description, the reference beam 132 is diffracted from the diffraction grating 508 on the glass plate 507 forming part of the primary imaging system. It should also be noted that the diffraction grating 508 is preferably located on a portion of the glass plate 507 that is outside the primary image path (i.e. so that the diffraction grating 508 does not interfere with the imaging of the reticle onto the wafer). Alternatively, the reference beam can be produced in some other manner, e.g. it can be produced as a separate beam component that is not diffracted from a diffraction grating (so long as the reference beam component remains essentially unaffected by movement of the image plane 110 lateral to the primary imaging path).

The measurement beam 134 is directed at the measurement diffraction grating 130 on the wafer, and then processed in the manner described above, to produce the diffracted measurement beam component, while the path of the reference beam 132 is such that the reference beam is unaffected by changes in the lateral position of the image plane 110. In the illustrated example, the measurement beam 134 is diffracted along the path shown by arrow 134b, while the reference beam 132 is diffracted from the diffraction grating 508 along the path shown by arrow 132b. The reference and measurement beam components are redirected by the beam splitter 503, and the beam splitting/combining optic 512 and are interferometrically detected by the detector 156. Phase changes in the diffracted measurement beam component, due to changes in the lateral alignment of the wafer and the image plane, would produce characteristic changes in the interferometric signal at the detector 156. The output of the detector 156 reflect such interferometric changes in the lateral alignment of the image plane, and that output can be used, where desired, to adjust the lateral position of the wafer stage 126, thereby to adjust the lateral position of the wafer 122 and the image plane 110.

While FIGS. 3 and 3b show a measurement diffraction grating 130 integrally connected with the wafer 122, the measurement diffraction grating can be integrally connected with a portion of the wafer stage 126, preferably a portion of the wafer stage 126 that is outside the primary imaging path, and in such a manner that when the wafer stage moves laterally relative to the primary imaging path, the measurement diffraction grating moves laterally with the wafer stage. Thus, FIG. 3 shows a measurement diffraction grating 520 on the wafer stage 126, and that measurement diffraction grating can be provided in addition to, or as an alternative to, the diffraction grating 130 integrally connected with the wafer 122. The measurement beam 134 can be directed at the diffraction grating 520 on the wafer stage 126, and diffracted by the diffraction grating 520 in the manner described above. The reference beam 132 can be produced in the same manner described above. The measurement and reference beam components would then be superimposed and detected inferometrically by the detector 156, to produce output related to the lateral alignment of the wafer stage 126, the wafer 122 and the image plane 110 relative to the primary imaging path.

Another option, in accordance with the principles of the present invention, is to provide the measurement diffraction grating integrally connected with the object plane, to enable lateral alignment of the object plane to be detected. In FIG. 1, the object plane is integrally connected with the scanning object (i.e. the reticle 106), and the measurement diffraction grating 530 is integrally connected with the scanning object in such a manner that when the object plane moves laterally with the scanning object relative to the primary imaging path, the measurement diffraction grating 530 moves laterally with the scanning object. The reference beam 132 can be produced from the diffraction grating 508 on the plate 507, or in another manner, as described above, so long as the reference beam does not move laterally with the object plane. The measurement and reference beam components would then be superimposed and detected inferometrically by a detector (i.e. either detector 156 or a detector similar to detector 156), to produce output related to the lateral alignment of the reticle 106 and the object relative to the primary imaging path.

In all of the disclosed embodiments, when the lateral alignment of the image plane or the object plane changes, the lateral position of the measurement diffraction grating integrally connected with the image or object plane (as the case may be) changes, and the phase of the diffracted measurement beam is shifted. This phase change is detected interferometrically at detector 156, using homodyne, pseudo-heterodyne or heterodyne techniques, all of which are well known to those in the art. The phase of the diffracted measurement beam would then enable the lateral alignment of the image or object plane to be detected within a fraction of one period of the measurement diffraction grating, which would preferably be on the order of the wavelength of the measurement beam.

It should also be noted that a system and method, as described herein is useful with a number of imaging optical systems. For example, it can be used with "wet" imaging optical system, in which the imaging onto the image plane 110 is through an immersion fluid layer, and also with a "dry" imaging optical system, in which imaging onto the image plane 110 is through a medium such as a gas, air or a vacuum.

Additionally, while disclosed in connection with one form of lithographic optical imaging system, the principles of the present invention can be used with various types of lithographic imaging optical systems. For example, in FIG. 1, the lithographic imaging optical system shown in full lines is a scanning lithographic imaging optical system, in which the scanning slit 104 and the reticle 106 have openings that move in synchronism to produce the image at the image plane 110. The lithographic imaging optical system could also be of the "step and repeat type", which is well known to those in the art, and in which the scanning slit 104, the reticle 106 have larger openings, and are moved in a stepped fashion to produce the image at the image plane 110.

Further, the principles of the present invention can be applied to a general optical system such as an imaging optical system for a microscope or inspection system.

With the foregoing disclosure in mind, it is believed that various ways that a system and method can be designed to detect the lateral alignment of an image plane or an object plane in an imaging optical system, according to the principles of the present invention, will be apparent to those in the art.

The invention claimed is:

1. Apparatus for detecting changes in the lateral position of an moveable object with respect to image plane or object plane in an imaging optical system, comprising (a) a primary imaging optical system configured to direct an image along a primary imaging path from an object plane to an image plane,
(b) a measurement diffraction grating being integrally connected with the moveable object and configured to move with the the moveable object in directions lateral to the primary imaging path;
(c) a beam generator arranged outside the primary imaging path, that generates a reference beam and a measurement beam;
(d) the measurement beam directed at the measurement diffraction grating to produce a diffracted measurement beam, and the reference beam being directed at a component of the apparatus that cannot move laterally with the image plane or the object plane, to produce a diffracted reference beam, such that the reference beam is unaffected by changes in the lateral position of the moveable object; and
(e) a detection system that directs at least a component of the reference beam and a component of the diffracted measurement at a detector configured interferometrically to detect phase changes between the reference beam component and the diffracted measurement beam component, to produce an output related to changes in the lateral position of the moveable object.

2. Apparatus of claim 1, wherein the object comprises a wafer, the image plane is integrally connected with a surface of the wafer, and the measurement diffraction grating is integrally connected with the surface of the wafer in such a manner that when the image plane moves laterally with the wafer relative to the primary imaging patent, the measurement diffraction grating moves laterally with the image plane.

3. Apparatus of claim 2, wherein at least one of the optics of the primary imaging system has a reference diffraction grating that is integrally connected with a portion of the optic located outside the primary imaging path, and wherein the reference beam is diffracted from the diffraction grating on the portion of the optic to produce the reference beam that is directed at the detector.

4. Apparatus of claim 1, wherein the object comprises a wafer stage, the image plane is integrally connected with a surface of a wafer that is supported on the wafer stage, and wherein the measurement diffraction grating is integrally connected with a portion of the wafer stage that is outside the primary imaging path in such a manner that when the wafer stage moves laterally relative to the primary imaging path, the measurement diffraction grating moves laterally with the wafer stage.

5. Apparatus of claim 4, wherein at least one of the optics of the primary imaging system has a reference diffraction grating thereon that is integrally connected with a portion of the optic located outside the primary imaging path, and wherein the reference beam is diffracted from the diffraction grating on the portion of the optic to produce the reference beam that is directed at the detector.

6. Apparatus of claim 1, wherein the object comprises a scanning object, the object plane is integrally associated with the scanning object, and wherein the measurement diffraction grating is integrally connected with the scanning object in such a manner that when the object plane moves laterally with the scanning object relative to the primary imaging path, the measurement diffraction grating moves laterally with the scanning object.

7. Apparatus of claim 6, wherein the scanning object comprises a reticle.

8. Apparatus of claim 7, wherein at least one of the components of the primary imaging system has a reference diffraction grating thereon that is integrally connected with a portion of the optic located outside the primary imaging path, and wherein the reference beam is diffracted from the diffraction grating on the portion of the optic to produce the reference beam that is directed at the detector.

9. Apparatus of claim 1, wherein at least one of the components of the primary imaging system has a reference diffraction grating thereon that is integrally connected with a portion of the optic located outside the primary imaging path, and wherein the reference beam is diffracted from the diffraction grating on the portion of the optic to produce the reference beam that is directed at the detector.

10. A method for detecting changes in the lateral position of a moveable object with respect to an imaging optical system, comprising
(a) directing an image along a primary imaging path from an object plane to an image plane,
(b) providing a measurement diffraction grating integrally connected with the moveable object in a manner such that the reference diffraction grating moves with the moveable object in directions lateral to the primary imaging path;
(c) providing a reference beam and a measurement beam that originate outside the primary imaging path;
(d) directing the measurement beam at a measurement diffraction grating on the moveable object to produce a diffracted measurement beam and producing a diffracted reference beam from a component of the optical imaging system that cannot move with the moveable object in directions lateral to the primary imaging path; and
(e) detecting phase changes between the reference beam and the diffracted measurement beam interferometrically, to producing an output related to changes in the lateral position of the one of the image plane and the object plane.

11. Method of claim 10, wherein the primary imaging path is a lithograph imaging path that images a wafer, wherein the moveable object comprises a wafer, the image plane is integrally connected with a surface of the wafer, and the measurement diffraction grating is integrally connected with the surface of the wafer in such a manner that when the image plane moves laterally with the wafer relative to the primary imaging path, the measurement diffraction grating moves laterally with the image plane.

12. Method of claim 11, wherein at least one component of the optical imaging system has a reference diffraction grating that is provided on a portion of the component located outside the primary imaging path, and wherein the reference beam is diffracted from the diffraction grating on the portion of the component to produce the reference beam that is used in detecting phase changes between the reference beam and the diffracted measurement beam interferometrically.

13. Method of claim 10, wherein the primary imaging path is a lithograph imaging path that images a wafer that is supported on a wafer stage, wherein the image plane is integrally connected with a surface of the wafer, and wherein the measurement diffraction grating is integrally connected with a portion of the wafer stage that is outside the primary imaging path in such a manner that when the wafer stage moves laterally relative to the primary imaging path, the measurement diffraction grating moves laterally with the wafer stage.

14. Method of claim 13, wherein at least one component of the optical imaging system has a reference diffraction grating that is provided on a portion of the component located outside the primary imaging path, and wherein the reference beam is diffracted from the diffraction grating on the portion of the component to produce the reference beam that is used in detecting phase changes between the reference beam and the diffracted measurement beam interferometrically.

15. Method of claim 10, wherein the primary imaging path is a lithograph imaging path in which the moveable object comprises a scanning object, the object plane is integrally associated with the scanning object, and wherein the measurement diffraction grating is integrally connected with the scanning object in such a manner that when the object plane moves laterally with the scanning object relative to the primary imaging path, the measurement diffraction grating moves laterally with the scanning object.

16. Method of claim 15, wherein, at least one component of the optical imaging system has a reference diffraction grating that is provided on a portion of the component located outside the primary imaging path, and wherein the reference beam is diffracted from the diffraction grating on the portion of the component to produce the reference beam that is used in detecting phase changes between the reference beam and the diffracted measurement beam interferometrically.

17. Method of claim 10, wherein at least one component of the optical imaging system has a reference diffraction grating that is provided on a portion of the component located outside the primary imaging path, and wherein the reference beam is diffracted from the diffraction grating on the portion of the component to produce the reference beam that is used in detecting phase changes between the reference beam and the diffracted measurement beam interferometrically.

* * * * *